US012585205B2

(12) United States Patent
Donaher

(10) Patent No.: US 12,585,205 B2
(45) Date of Patent: Mar. 24, 2026

(54) LOW NUMERICAL APERTURE ALIGNMENT

(71) Applicant: Onto Innovation Inc., Wilmington, MA (US)

(72) Inventor: J. Casey Donaher, Westford, MA (US)

(73) Assignee: Onto Innovation Inc., Wilmington, MA (US)

( * ) Notice: Subject to any disclaimer, the term of this patent is extended or adjusted under 35 U.S.C. 154(b) by 81 days.

(21) Appl. No.: 18/061,737

(22) Filed: Dec. 5, 2022

(65) Prior Publication Data

US 2023/0314967 A1 Oct. 5, 2023

Related U.S. Application Data

(60) Provisional application No. 63/327,075, filed on Apr. 4, 2022.

(51) Int. Cl.
*G03F 9/00* (2006.01)
*G06T 7/13* (2017.01)
(Continued)

(52) U.S. Cl.
CPC .............. *G03F 9/7088* (2013.01); *G06T 7/13* (2017.01); *G06T 7/337* (2017.01); *G06T 7/74* (2017.01);
(Continued)

(58) Field of Classification Search
CPC ......... G03F 9/7088; G06T 7/13; G06T 7/337; G06T 7/74; G06T 2207/10048; G06T 2207/10056; G06T 2207/30148; G06T 2207/30204; H04N 5/33; H04N 23/90; H04N 25/76; H04N 25/20; G02B 21/36
See application file for complete search history.

(56) References Cited

U.S. PATENT DOCUMENTS 5,734,155 A * 3/1998 Rostoker ........... H01L 31/02325
257/E31.128
5,926,257 A 7/1999 Mizouchi
(Continued)

FOREIGN PATENT DOCUMENTS

CN 110095955 8/2019
CN 113093487 7/2021
(Continued)

OTHER PUBLICATIONS

"International Application Serial No. PCT US2023 065285, International Search Report mailed Jul. 28, 2023", 3 pages.
(Continued)

*Primary Examiner* — Michael E Teitelbaum
(74) *Attorney, Agent, or Firm* — Schwegman Lundberg & Woessner, P.A.

(57) ABSTRACT

Disclosed herein are examples of a photolithography machine with fast alignment. The machine may include a stage to hold and move a substrate and a projection system to project images on a plurality of exposure regions of the substrate. The machine may also include an alignment system positioned adjacent to the projection system. The alignment system may include a plurality of microscope cameras with a fixed focus, each microscope camera configured to detect a respective fiducial in a respective exposure region of the substrate.

21 Claims, 8 Drawing Sheets

(51) Int. Cl.

| | |
|---|---|
| *G06T 7/33* | (2017.01) |
| *G06T 7/73* | (2017.01) |
| *H04N 5/33* | (2023.01) |
| *H04N 23/90* | (2023.01) |
| *H04N 25/76* | (2023.01) |

(52) U.S. Cl.

CPC ............... *H04N 5/33* (2013.01); *H04N 23/90* (2023.01); *H04N 25/76* (2023.01); *G06T 2207/10048* (2013.01); *G06T 2207/10056* (2013.01); *G06T 2207/30148* (2013.01); *G06T 2207/30204* (2013.01)

(56) References Cited

U.S. PATENT DOCUMENTS

| | | | | |
|---|---|---|---|---|
| 6,916,584 | B2 | 7/2005 | Sreenivasan et al. | |
| 7,345,739 | B2 | 3/2008 | Hendriks et al. | |
| 7,385,671 | B2 | 6/2008 | Gardner et al. | |
| 9,298,099 | B2 | 3/2016 | Wu et al. | |
| 9,323,163 | B2 | 4/2016 | Wu et al. | |
| 10,599,055 | B1 | 3/2020 | Coskun et al. | |
| 2005/0264777 | A1 | 12/2005 | Gardner et al. | |
| 2006/0249859 | A1 | 11/2006 | Eiles et al. | |
| 2008/0273183 | A1 | 11/2008 | Staals et al. | |
| 2009/0097008 | A1 | 4/2009 | Mos et al. | |
| 2011/0292362 | A1* | 12/2011 | Enomoto | G03F 9/7088 |
| | | | | 355/52 |
| 2015/0333014 | A1* | 11/2015 | Wirz | H01L 21/76871 |
| | | | | 257/774 |
| 2018/0017878 | A1* | 1/2018 | Bibby, Jr. | G01J 1/429 |
| 2018/0130197 | A1* | 5/2018 | Weiss | H04N 9/8205 |
| 2019/0224679 | A1* | 7/2019 | Smith | G01N 27/44773 |
| 2019/0235391 | A1* | 8/2019 | Bijnen | G03F 7/70425 |
| 2021/0382403 | A1* | 12/2021 | Goorden | G03F 7/70633 |
| 2025/0046639 | A1* | 2/2025 | Wagenleitner | H01L 21/681 |

FOREIGN PATENT DOCUMENTS

| | | |
|---|---|---|
| JP | 2001118774 A | 4/2001 |
| TW | 201107735 | 3/2011 |
| TW | I736730 | 8/2021 |
| WO | 0208835 | 1/2002 |
| WO | 2020031041 | 2/2020 |
| WO | 2023196783 | 10/2023 |

OTHER PUBLICATIONS

"International Application Serial No. PCT US2023 065285, Written Opinion mailed Jul. 28, 2023", 5 pages.

"Taiwanese Application Serial No. 112112864, Office Action mailed Apr. 22, 2024", with machine English translation, 20 pages.

"International Application Serial No. PCT/US2023/065285, International Preliminary Report on Patentability mailed Oct. 17, 2024", 7 pgs.

"Korean Application Serial No. 20-2024-7000080 Voluntary Amendment Filed Nov. 22, 2024", w/ english claims, 13 pgs.

"Taiwanese Application Serial No. 112112864, Response filed Oct. 22, 2024 to Office Action mailed Apr. 22, 2024", w/ current English claims, 11 pgs.

"Chinese Application Serial No. 202390000390.5, Notification to Make Rectification mailed Sep. 8, 2025", with manual English translation, 5 pages.

"Chinese Application Serial No. 202390000390.5, Response filed Nov. 10, 2025 to Notification to Make Rectification mailed Sep. 8, 2025", with English claims, 34 pages.

"Korean Application Serial No. 20-2024-7000080, Notice of Preliminary Rejection mailed Oct. 30, 2025", with English translation, 22 pages.

\* cited by examiner

Substrate  108

Alignment Mark
Location

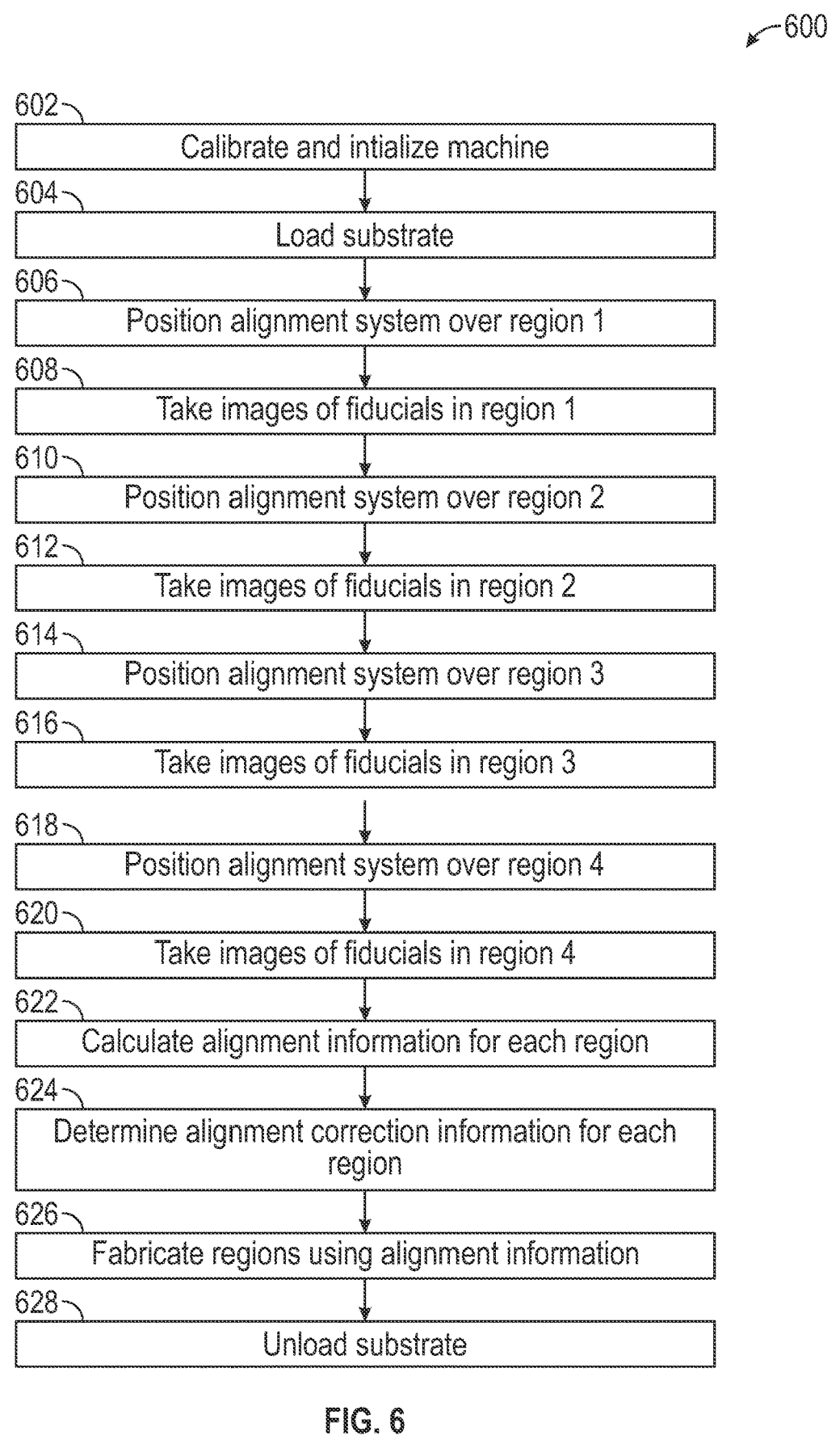

600

602 — Calibrate and intialize machine

604 — Load substrate

606 — Position alignment system over region 1

608 — Take images of fiducials in region 1

610 — Position alignment system over region 2

612 — Take images of fiducials in region 2

614 — Position alignment system over region 3

616 — Take images of fiducials in region 3

618 — Position alignment system over region 4

620 — Take images of fiducials in region 4

622 — Calculate alignment information for each region

624 — Determine alignment correction information for each region

626 — Fabricate regions using alignment information

628 — Unload substrate

FIG. 6

LOW NUMERICAL APERTURE ALIGNMENT

CROSS-REFERENCE TO RELATED APPLICATION

This application claims the benefit of priority to U.S. Provisional Patent Application Ser. No. 63/327,075 filed Apr. 4, 2022, the contents of which are incorporated herein by reference in its entirety.

TECHNICAL FIELD

The present disclosure generally relates to alignment techniques associated with photolithographic processing.

BACKGROUND

Photolithography is typically used to fabricate patterns on a substrate, such as a silicon (semiconductor) wafer or a flat panel display. Generally, photolithography involves transferring a pattern from a photomask (or reticle) to a photosensitive surface on a substrate.

A robot is used to place the substrates onto a substrate stage within the photolithographic machine, to prepare the substrate for processing. Typically, the substrate has one or more fiducial indicators (e.g., a notch or flat portion on the edge of the substrate) etched or otherwise formed into the edge of the substrate. Alignment processes are used to align the substrate using the fiducial indicators. Conventional alignment techniques typically use high-resolution, high numerical aperture (NA) microscopes to perform alignment. These high NA microscopes have a small depth of focus (e.g., <9 micron depth), however. The small depth of focus can be an issue because substrates may not be completely flat; for example, substrates may be warped or bowed. Moreover, other components in the photolithographic machine can also add unevenness to the substrate processing. Therefore, conventional alignment techniques are not well equipped to image fiducials at varied heights.

SUMMARY

Disclosed herein are examples of photolithography machines and processing techniques using an alignment system to align exposure regions based on fiducials. The alignment system can include a plurality of microscope cameras with a fixed focus. Thus, the microscope cameras can have a low numerical aperture (NA), and independent focus adjustment is not needed. The use of cameras with lower NA can increase operating speed by eliminating the need to individually focus each microscope camera.

This disclosure describes photolithography machine with fast alignment. The photolithography machine includes a stage to hold and move a substrate, and a projection system to project images on a plurality of exposure regions of the substrate. The photolithography machine also includes an alignment system positioned adjacent to the projection system, the alignment system including a plurality of microscope cameras with a fixed focus, each microscope camera configured to detect a respective fiducial in a respective exposure region of the substrate.

This disclosure also describes method to photolithograph a substrate, the method comprising: loading the substrate on a stage of a photolithography machine; positioning the stage such that an alignment system of the photolithography machine is opposite a first exposure region of the substrate, wherein the alignment system includes a plurality of microscope cameras having a fixed focus; capturing a first set of images using the plurality of microscope cameras of the first exposure region, each image including a respective fiducial associated with the first exposure region; determining alignment correction information for the first exposure region based on the first set of images; and projecting images on the first exposure region based on the alignment correction information.

This disclosure further describes an alignment system for a photolithography machine. The alignment system includes a supporting structure positioned adjacent to a projection system of the photolithography machine. The alignment system also includes a plurality of microscope cameras coupled to the supporting structure having a fixed focus, each microscope camera configured to detect a respective fiducial in a respective exposure region of a substrate.

BRIEF DESCRIPTION OF THE DRAWINGS

Various ones of the appended drawings merely illustrate example embodiments of the present disclosure and should not be considered as limiting its scope.

FIG. 6 illustrates a flow diagram for a method for photolithographic processing with alignment.

DETAILED DESCRIPTION

A substrate can include fiducials. As described herein, a photolithography machine with an alignment system can align exposure regions based on the fiducials. The alignment system can include a plurality of microscope cameras with a fixed focus. The microscope cameras can have a low numerical aperture (NA). The use of cameras with lower NA can increase operating speed by eliminating the need to individually focus each microscope camera.

Figure 1A:
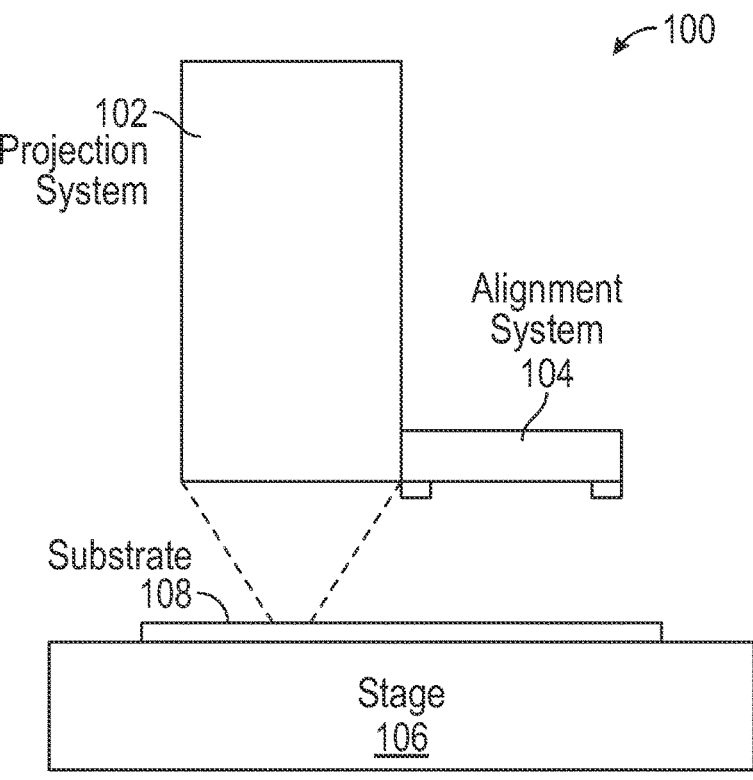
FIG. 1A illustrates example portions of a photolithography machine.
Figure 1B:
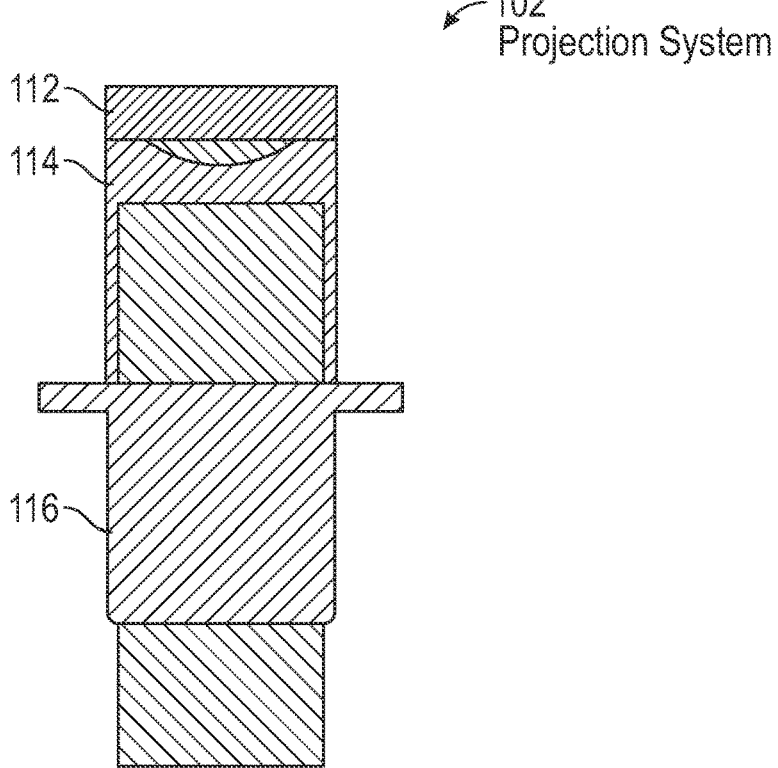
FIG. 1B illustrates example portions of a projection system.
Figure 1C:
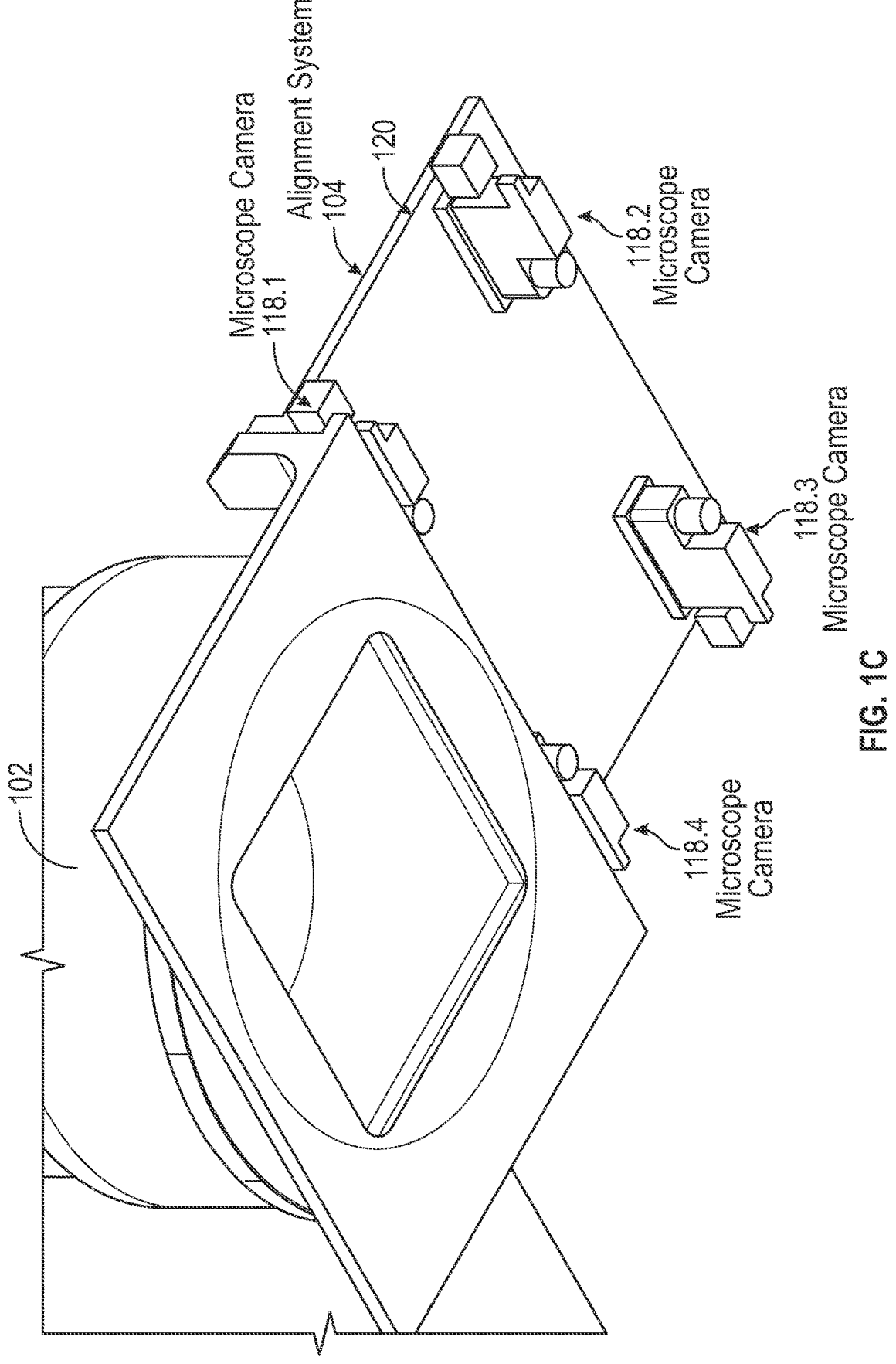
FIG. 1C illustrates example portions of an alignment system.

FIGS. 1A-1C illustrates example portions of a photolithography machine 100. The photolithography machine may include a projection system 102, an alignment system 104, and a stage for carrying one or more substrates 108. The projection system 102 and alignment system 104 may be positioned adjacent to each other and may be positioned opposite (e.g., above) the stage 106.

The projection system 102 may include one or more projection camera systems. FIG. 1B illustrates example portions of a projection system 102. The projection system 102 may include an illuminator 112, a reticle stage 114, and a projection lens 116. The projection system 102 may be configured to expose patterns or images onto the substrate in respective exposure regions. If a plurality of projection camera systems are provided, then the projection camera systems may be configured to expose their respective patterns or images substantially at the same time (e.g., concurrently or simultaneously).

The illuminator 112 may include a light source to generate light on top of the reticles placed on the reticle stage, respectively. The light source may be provided using a UV LED (ultra-violet light emitting diode) system and associated optics.

The reticle stage 114 may include alignment devices to align the reticle placed thereon relative to the stage 106. The alignment devices may include 6-axis reticle chuck, as described for example in U.S. Pat. No. 7,385,671, entitled "High Speed Lithography Machine and Method," which is incorporated herein by reference in its entirety, including but not limited to those portions that specifically appear hereinafter, the incorporation by reference being made with the following exception: In the event that any portion of the above-referenced patent is inconsistent with this application, this application supersedes the above-referenced patent. Each axis of the 6-axis chuck may have built-in single-axis, coarse, velocity and position sensors.

In the examples of multiple camera systems, each reticle stage may be configured to hold a separate reticle (or photomask or image source) to allow for different pattern fabrication. The reticle stages may be aligned independently relative to the stage to account for different variations on the substrate or different pattern fabrication. Each camera system may have its own set of sensors to align its photomask (or reticle) with the substrate plane to ensure that an optical axis of the camera is perpendicular to the substrate plane. For example, the sensors (e.g., six sensors) for each camera may use a metrology frame as reference for proper alignment. The metrology frame may be straight and rigid and therefore provide a reference for flatness, straightness, height, position, etc.

The reticle stage 114 may be aligned independently relative to the stage to account for different variations on the substrate or different pattern fabrication. The projection lens 116 may project the pattern or image on each of the reticles onto the substrate placed on the stage. The projection lens 116 may include one or more optical lenses. The projection lens 116 may include individual, real-time, auto focus sensors. The optical properties of the projection lens 116 may be adjusted based on the auto-focus sensors to focus the projected pattern or image on the substrate as needed.

The stage 106 may be provided below the cameras and may carry one or more substrates during fabrication. The stage may include a granite structure. The stage may be movable in the x, y, and θ directions.

The alignment system 104 may be used to align the substrate, and in particular respective exposure regions of the substrate before exposure by the projection camera system. The alignment system may include a plurality of microscope cameras 118.1-118.4. For example, alignment system may include four microscope cameras 118.1-118.4.

The alignment system 104 may include a supporting structure 120 supporting the plurality of microscope cameras 118.1-118.4. The microscope cameras 118.1-118.4 may be movable in the x and y direction, but the microscope cameras 118.1-118.4 have a fixed z position. Thus, the microscope cameras 118.1-118.4 have a fixed focus. That is, independent actuators may not be used to move the microscope cameras 118.1-118.4 to adjust their respective focus. The microscope cameras 118.1-118.4, instead, include a microscope objective with a low numerical aperture (NA) so that independent focus adjustment is not needed. In some examples, the microscope cameras 118.1-118.4 may each have a NA of equal to or less than 0.15. The low NA yields a higher focus depth so that independent focus adjustment in the z-axis is not needed. Depth of focus of the microscope camera is not needed. Depth of focus of the microscope camera is related to the NA. In particular, the depth of focus is proportional to the square of NA ($NA^2$). The use of lower NA may sacrifice resolution, but provides the benefit of faster processing by eliminating the need to individually focus each microscope camera.

Hence, the microscope cameras 118.1-118.4, as described herein, can image and detect fiducials at various and uncertain heights quickly and without adjusting the focus of the cameras in the z-axis leading to fast alignment. Moreover, the microscope cameras 118.1-118.4 may be used to detect fiducials not just on the top surface of the substrate, but on the bottom surface or intermediate layers (with the use of infrared sensors).

Each microscope camera 118.1-118.4 can simultaneously perform x,y detection of the respective fiducial. In the examples with four microscope cameras, this results in simultaneously providing eight points of information for each exposure region (each camera providing two points of information). This may lead to faster throughput and better overlay.

The microscope cameras 118.1-118.4 may be top mounted on the supporting structure 120. In some examples, the microscope cameras 118.1-118.4 may be arranged in a rectangular formation as shown, with each camera located at a corner of the rectangular formation. The microscope cameras 118.1-118.4 may be movable in the x,y direction to accommodate different fiducial positions for various substrate recipes. An x,y actuator may be provided with a gripper arm to grab each microscope and position each microscope cameras 118.1-118.4. In some examples, one microscope camera 118.1 may be kept stationary, and the other microscope cameras 118.2-118.4 may be moved relative to the stationary microscope camera 118.1.

Figure 2:
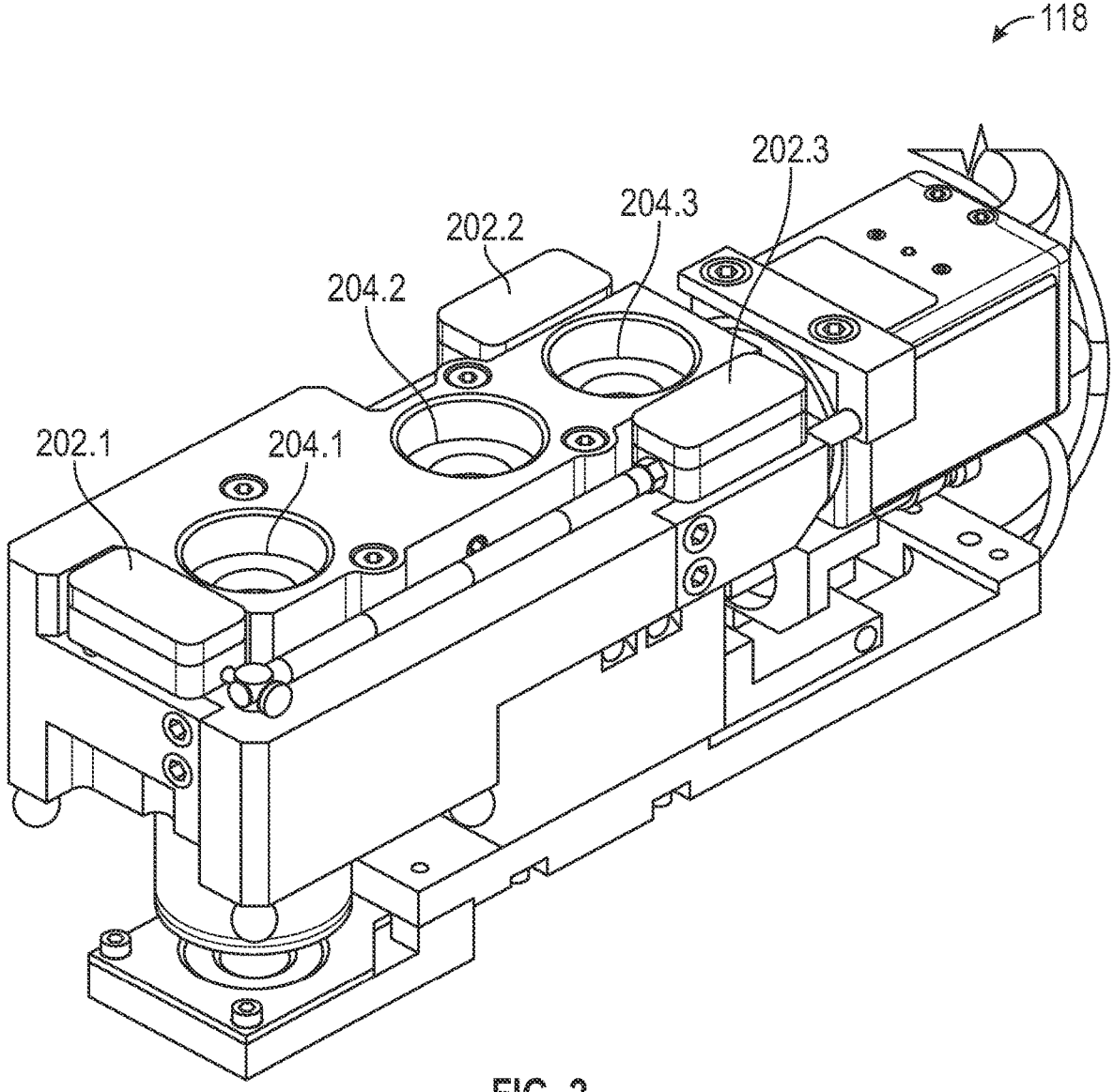
FIG. 2 shows example portions of a microscope camera.

FIG. 2 shows example portions of a microscope camera 118. The microscope camera 118 may include air bearings 202.1-202.3 and magnets 204.1-204.3 for positioning the microscope camera in the x,y directions. In this example, three air bearings and three magnets and are provided, but more or less air bearings and magnets may be used. Using the air bearings 202.1-202.3 and magnets 204.1-204.3, the microscope camera 118 may be held by magnetically preloaded air bearings. That is, air in the air bearings 202.1-202.3 may be turned on to separate the magnetic hold to move the microscope camera 118 to its specified location, and then the air may be turned off to keep the microscope camera in place using the magnets 204.1-204.3.

Figure 3:
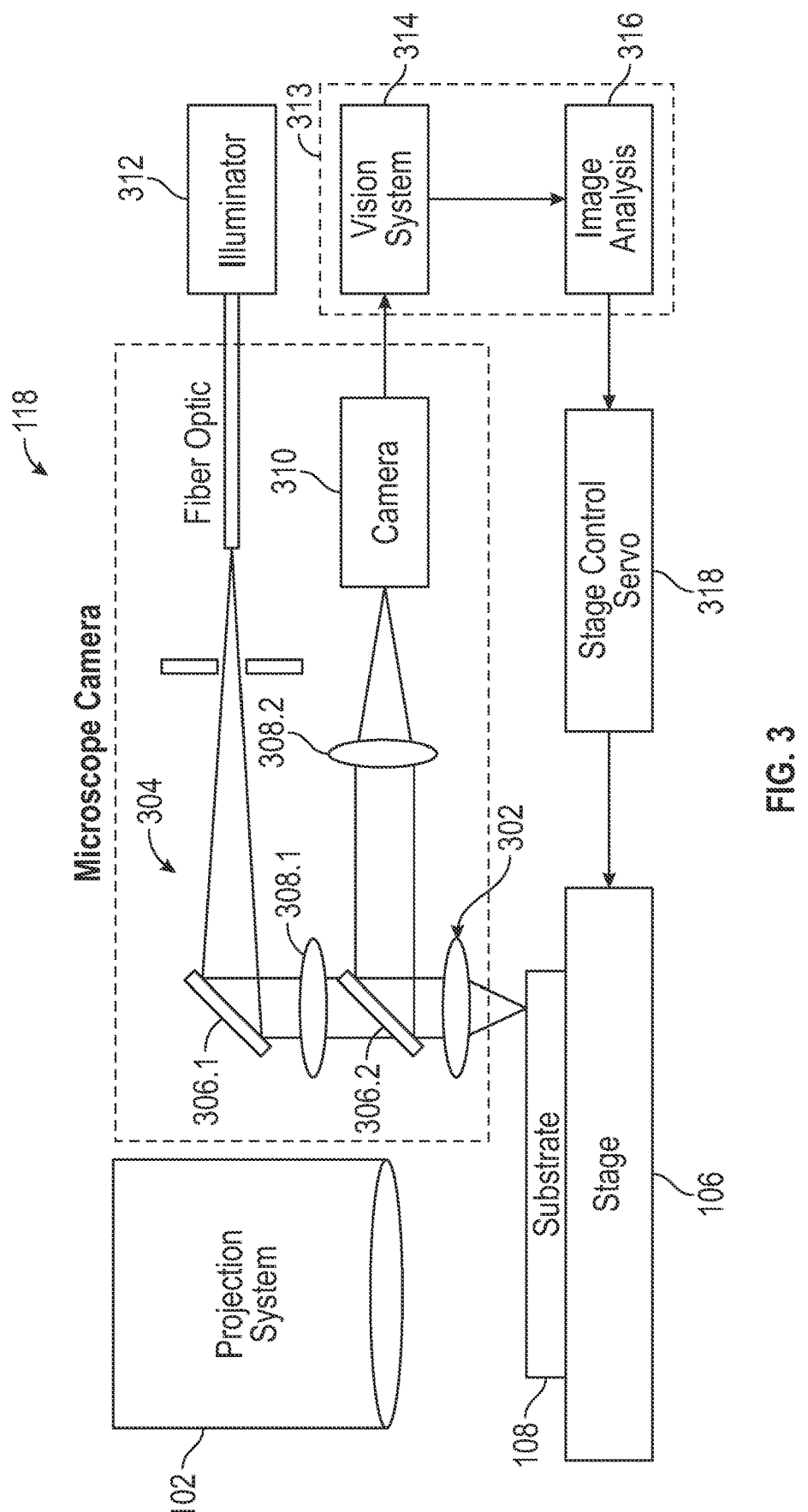
FIG. 3 shows a simplified block diagram of components of a microscope camera.

FIG. 3 shows a simplified block diagram of components of a microscope camera 118. The microscope camera 118 may include microscope objective 302 with a low NA as described herein, an optical system 304 with fold mirrors 306.1-306.2 and lenses 308.1-308.2, a camera 310, and an illuminator 312. The microscope objective 302 may provide an NA for the microscope camera that is equal to or less than 0.15. The illuminator 312 may provide bright field and/or dark field LED illumination. The camera 310 may be provided as an image sensor, such as a CMOS or CCD sensor. In some example, the camera 310 may be provided as an infrared sensor, such as InGaAs sensor.

The camera 310 may be coupled to a processor 313 including a vision system module 314 and an image analysis module 316. The processor 313 may process the images generated by the camera and analyze the images to detect and determine the location of the fiducial. The processor 313 may execute machine vision and edge detection algorithms to determine location of the fiducial. Based on the locations of other fiducials associated with the plurality of cameras, alignment correction information may be calculated. Based on the alignment correction, the stage 106 may be moved to adjust the position of the substrate by a stage control servo 318 prior to exposure of the respective exposure region.

The alignment correction information may also be used by the projection system 102 to adjust its components, as described, above before exposure of the respective exposure region. The alignment correction information may be used to adjust x, y offset, θ, magnification, etc.

Figure 4:
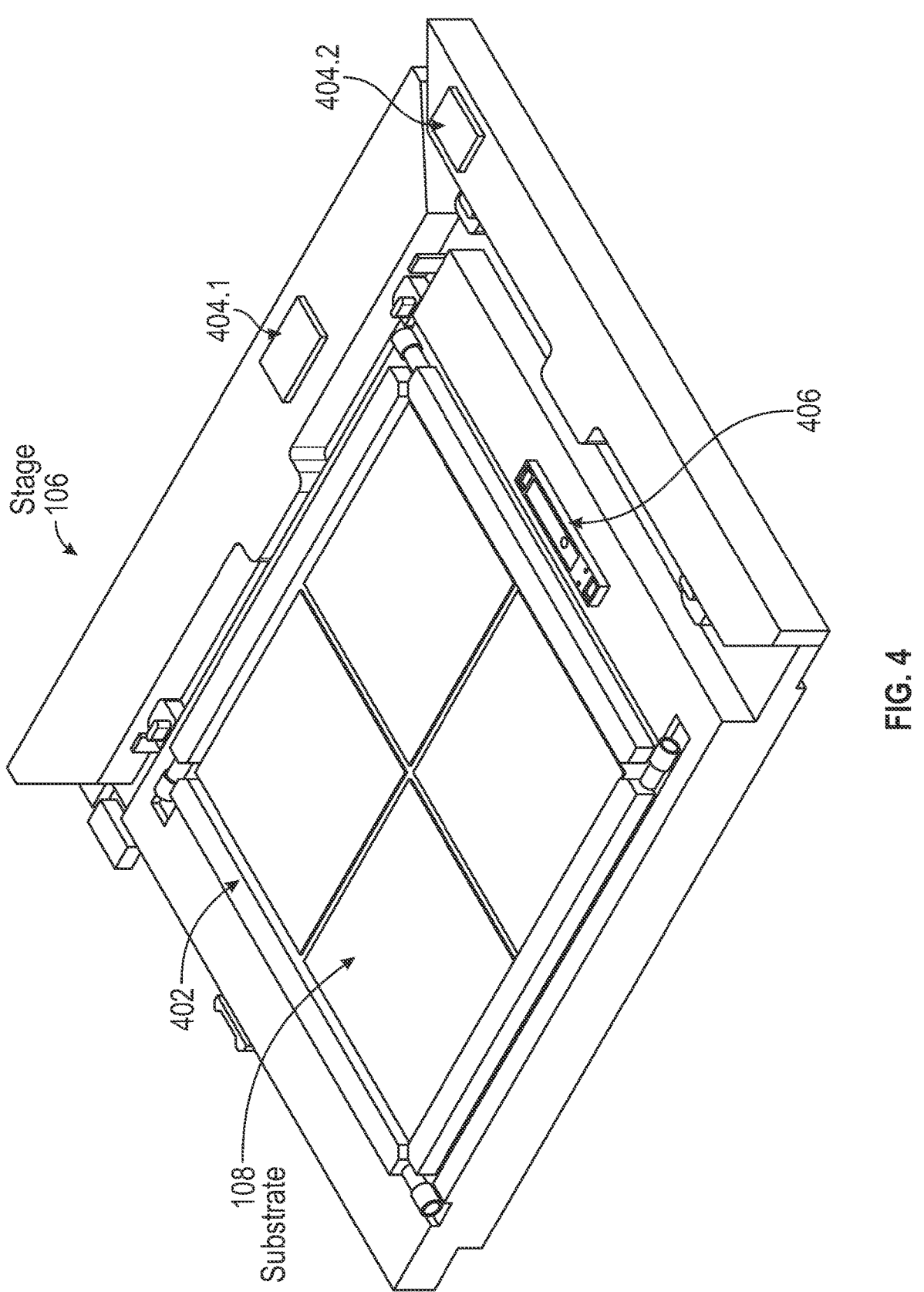
FIG. 4 shows examples portions of a stage.

FIG. 4 shows examples portions of a stage 106 with a substrate 108. The substrate 108 may be held in place on the stage 106 with edge clamps 402. For example, four-side edge clamping mechanisms may be used. The stage 106 may also include interferometer mirrors 404.1-404.2 for providing laser interferometer position feedback for stage movement. As mentioned above, the stage 106 can move in the x, y, and θ direction. Metrology sensors 406 may also be provided and may be used for system calibrations.

Figure 5:
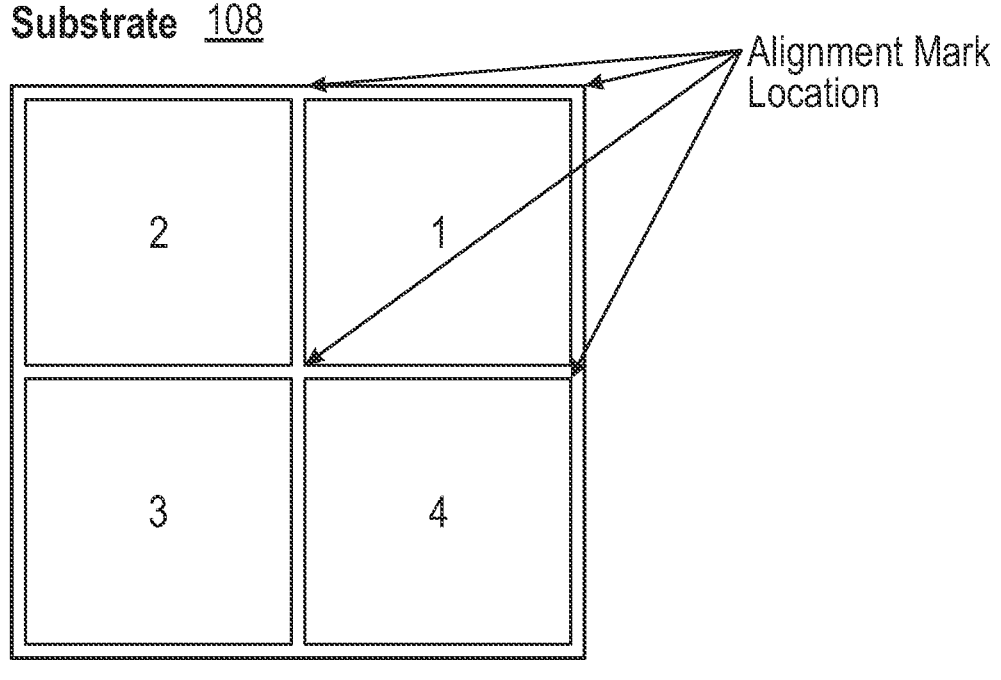
FIG. 5 illustrates a substrate with a plurality of exposure regions.

FIG. 5 illustrates a substrate 108 with a plurality of exposure regions. In this example, the substrate 108 may have four exposure regions (labeled 1-4) separated by copper material for machine handling. The substrate 108 may have a different number of exposure regions and four exposure regions are described for illustration purposes only; other number of exposure regions may be provided. Each exposure region may have a plurality of fiducials (alignment marks). In this example, each exposure region may have four fiducials corresponding to the four microscope cameras in the alignment system. The fiducials may be located at the corners of the exposure region on the top surface of the substrate 108. Examples of fiducials include cross shapes, drill holes, drill hole patterns, etc.

In some examples, the fiducials may be located on a bottom surface of the substrate or intermediate layers of the substrate. In these examples, the microscope camera may include an infrared sensor, as described above, to detect the fiducials.

FIG. 6 illustrates a flow diagram for a method 600 for photolithographic processing with alignment. For example, the method can be performed using the photolithography machine 100 for a substrate 108 with four exposure regions as described above.

At operation 602, the photolithographic machine may be calibrated and initialized. For example, instructions (e.g., recipe) for the fabrication may be retrieved and loaded. The instructions may include information such as fabrication layout, exposure time, size of each exposure region, number of exposure regions, layout of exposure regions, location of fiducials, etc. Instructions regarding different reticle patterns may be pre-stored in a memory associated with a controller associated the photolithographic machine, and the instructions for the particular reticle(s) may be retrieved based on the loaded reticles. Based on the instructions, the microscope cameras in the alignment system may be moved in the x,y direction to match the fiducial positions specified in the recipe.

At operation 604, the substrate may be loaded onto the machine. For example, a load robot may place the substrate on the stage. The substrate may be clamped in place using edge clamps.

Next, the alignment process may be initiated for each of the exposure regions. At operation 606, the stage may be moved so that the alignment system is over the first exposure region. At operation 608, each microscope camera may take or capture an image of a respective fiducial in the first exposure region. The fiducials, for example, may be located at the corners of the exposure region with each microscope camera taking an image of a respective corner of the first exposure region. The microscope cameras have a low NA, as described herein, therefore no z-axis focus adjustment is needed. The z-position of the microscope cameras is fixed. The microscope cameras may have a fixed focus.

At operation 610, stage may be moved so that the alignment system is over the second exposure region. At operation 612, each microscope camera may take an image of a respective fiducial in the second exposure region.

At operation 614, stage may be moved so that the alignment system is over the third exposure region. At operation 616, each microscope camera may take an image of a respective fiducial in the third exposure region.

At operation 618, stage may be moved so that the alignment system is over the fourth exposure region. At operation 620, each microscope camera may take an image of a respective fiducial in the fourth exposure region.

At operation 622, alignment information for each exposure region may be calculated based on images taken at each exposure region. Based on information extracted from the images, locations of the fiducials may be determined and may be compared to the specified location in the recipe.

At operation 624, alignment correction information may be calculated and stored for each exposure region. The alignment correction information may be related to the stage position and projection system settings for each exposure region, as described above. For example, a regression algorithm may be used to determine alignment correction information.

Next, the exposure process may be initiated. At operation 626, patterns on the different regions may be fabricated using the alignment information for the respective exposure regions. For example, the stage is moved so that a first exposure region is provided below the projection system, and alignment correction is performed for the respective exposure region based on the alignment correction information for that exposure region. The projection system may then project an image on its reticle to fabricate the pattern on the image on the first exposure region of the substrate. The exposure process then continues to the other regions.

In some embodiments, exposures may be applied in a different order than the alignment process to minimize stage movement. For example, alignment process is performed in the order of exposure regions 1 to 2 to 3 to 4, while the exposure process is performed in the order of exposure regions 3 to 4 to 1 to 2 (see FIG. 5).

After all exposure regions are fabricated, the stage is moved to an unload position and substrate is released and unloaded at operation 628. For example, the load robot may remove the substrate from the stage. Another substrate may be loaded on to the machine and the method may repeat (e.g., perform alignment and exposure process).

Figure 7:
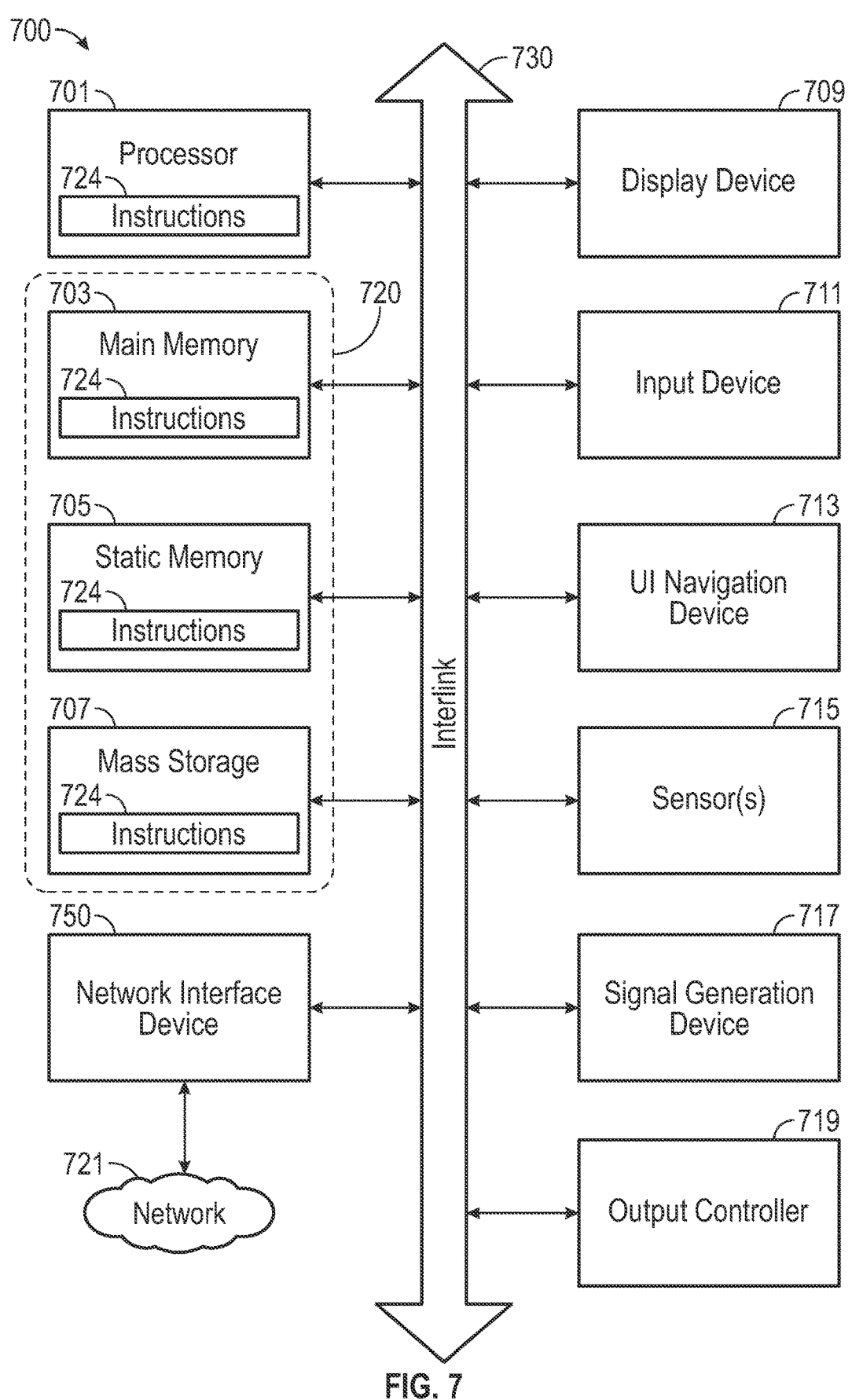
FIG. 7 illustrates a block diagram of an example machine upon which any one or more of the techniques (e.g., methodologies) discussed herein may be performed

The techniques shown and described in this document can be performed using a portion or an entirety of photolithographic machine as shown in FIGS. 1A-1C or otherwise using a machine 700 as discussed below in relation to FIG. 7. FIG. 7 illustrates a block diagram of an example comprising a machine 700 upon which any one or more of the techniques (e.g., methodologies) discussed herein may be performed. In various examples, the machine 700 may operate as a standalone device or may be connected (e.g., networked) to other machines.

In a networked deployment, the machine 700 may operate in the capacity of a server machine, a client machine, or both in server-client network environments. In an example, the machine 700 may act as a peer machine in peer-to-peer (P2P) (or other distributed) network environment. The machine 700 may be a personal computer (PC), a tablet device, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic or a number of components, or mechanisms. Circuitry is a collection of circuits implemented in tangible entities that include hardware (e.g., simple circuits, gates, logic, etc.). Circuitry membership may be flexible over time and underlying hardware variability. Circuitries include members that may, alone or in combination, perform specified operations when operating. In an example, hardware of the circuitry may be immutably designed to carry out a specific operation (e.g., hardwired). In an example, the hardware comprising the circuitry may include variably connected physical components (e.g., execution units, transistors, simple circuits, etc.) including a computer-readable medium physically modified (e.g., magnetically, electrically, such as via a change in physical state or transformation of another physical characteristic, etc.) to encode instructions of the specific operation. In connecting the physical components, the underlying electrical properties of a hardware constituent may be changed, for example, from an insulating characteristic to a conductive characteristic or vice versa. The instructions enable embedded hardware (e.g., the execution units or a loading mechanism) to create members of the circuitry in hardware via the variable connections to carry out portions of the specific operation when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine 700 (e.g., computer system) may include a hardware-based processor 701 (e.g., a central processing unit (CPU), a graphics processing unit (GPU), a hardware processor core, or any combination thereof), a main memory 703 and a static memory 705, some or all of which may communicate with each other via an interlink 730 (e.g., a bus). The machine 700 may further include a display device 709, an input device 711 (e.g., an alphanumeric keyboard), and a user interface (UI) navigation device 713 (e.g., a mouse). In an example, the display device 709, the input device 711, and the UI navigation device 713 may comprise at least portions of a touch screen display. The machine 700 may additionally include a storage device 720 (e.g., a drive unit), a signal generation device 717 (e.g., a speaker), a network interface device 750, and one or more sensors 715, such as a global positioning system (GPS) sensor, compass, accelerometer, or other sensor. The machine 700 may include an output controller 719, such as a serial controller or interface (e.g., a universal serial bus (USB)), a parallel controller or interface, or other wired or wireless (e.g., infrared (IR) controllers or interfaces, near field communication (NFC), etc., coupled to communicate or control one or more peripheral devices (e.g., a printer, a card reader, etc.).

The storage device 720 may include a machine readable medium on which is stored one or more sets of data structures or instructions 724 (e.g., software or firmware) embodying or utilized by any one or more of the techniques or functions described herein. The instructions 724 may also reside, completely or at least partially, within a main memory 703, within a static memory 705, within a mass storage device 707, or within the hardware-based processor 701 during execution thereof by the machine 700. In an example, one or any combination of the hardware-based processor 701, the main memory 703, the static memory 705, or the storage device 720 may constitute machine readable media.

While the machine readable medium is considered as a single medium, the term "machine readable medium" may include a single medium or multiple media (e.g., a centralized or distributed database, and/or associated caches and servers) configured to store the one or more instructions 724.

The term "machine readable medium" may include any medium that is capable of storing, encoding, or carrying instructions for execution by the machine 700 and that cause the machine 700 to perform any one or more of the techniques of the present disclosure, or that is capable of storing, encoding or carrying data structures used by or associated with such instructions. Non-limiting machine-readable medium examples may include solid-state memories, and optical and magnetic media. Accordingly, machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic or other phase-change or state-change memory circuits; magnetic disks, such as internal hard disks and removable disks; magneto-optical disks; and CD-ROM and DVD-ROM disks.

The instructions 724 may further be transmitted or received over a communications network 721 using a transmission medium via the network interface device 750 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., the Institute of Electrical and Electronics Engineers (IEEE) 802.22 family of standards known as Wi-Fi®, the IEEE 802.26 family of standards known as WiMax®), the IEEE 802.27.4 family of standards, peer-to-peer (P2P) networks, among others. In an example, the network interface device 750 may include one or more physical jacks (e.g., Ethernet, coaxial, or phone jacks) or one or more antennas to connect to the communications network 721. In an example, the network interface device 750 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 700, and includes digital or analog communications signals or other intangible medium to facilitate communication of such software.

Various Notes

Each of the non-limiting aspects above can stand on its own or can be combined in various permutations or combinations with one or more of the other aspects or other subject matter described in this document.

The above detailed description includes references to the accompanying drawings, which form a part of the detailed description. The drawings show, by way of illustration, specific implementations in which the invention can be practiced. These implementations are also referred to generally as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following aspects, the terms "including" and "comprising" are open-ended, that is, a system, device, article, composition, formulation, or process that includes elements in addition to those listed after such a term in an aspect are still deemed to fall within the scope of that aspect. Moreover, in the following aspects, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other implementations can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the aspects. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed implementation. Thus, the following aspects are hereby incorporated into the Detailed Description as examples or implementations, with each aspect standing on its own as a separate implementation, and it is contemplated that such implementations can be combined with each other in various combinations or permutations.

The invention claimed is:

1. A photolithography machine with fast alignment, comprising:
   a stage to hold and move a substrate;
   a projection system to project images on a plurality of exposure regions of the substrate; and
   an alignment system positioned adjacent to the projection system, the alignment system including a plurality of microscope cameras with a fixed focus, each microscope camera comprising a single microscope objective to provide a single fixed focus position and each microscope camera configured to detect a respective fiducial in a respective exposure region of the substrate,
   wherein each of the plurality of microscope cameras is configured to detect fiducials at different heights relative to between the stage and the plurality of microscope cameras using the respective fixed focus.

2. The photolithography machine of claim 1, wherein at least one of the plurality of microscope cameras has a numerical aperture equal to or less than 0.15.

3. The photolithography machine of claim 1, wherein each of the plurality of microscope cameras include a CMOS image sensor.

4. The photolithography machine of claim 1, wherein each of the plurality of microscope cameras include an infrared sensor.

5. The photolithography machine of claim 1, wherein the plurality of microscope cameras includes four microscope cameras arranged in a rectangular formation.

6. The photolithography machine of claim 1, further comprising at least one air bearing and at least one magnet to position the plurality of microscope cameras.

7. The photolithography machine of claim 1, further comprising:
   a processor to receive images from the plurality of microscope cameras, to determine locations of the fiducials based on the images, and to determine alignment correction information.

8. The photolithography machine of claim 7, wherein the processor uses a machine vision and edge detection algorithm to determine the locations of the fiducials.

9. The photolithography machine of claim 7, wherein the stage is configured to be moved based on the locations of the fiducials.

10. The photolithography machine of claim 7, wherein at least one component of the projection system is adjusted based on the alignment correction information.

11. A method to photolithograph a substrate, the method comprising:

loading the substrate on a stage of a photolithography machine;

positioning the stage such that an alignment system of the photolithography machine is opposite a first exposure region of the substrate, wherein the alignment system includes a plurality of microscope cameras having a fixed focus, each microscope camera comprising a single microscope objective to provide a single fixed focus position, wherein each microscope camera is configured to detect fiducials at different heights relative to between the stage and the plurality of microscope cameras using the respective fixed focus;

capturing a first set of images using the plurality of microscope cameras of the first exposure region, each image including a respective fiducial associated with the first exposure region;

determining alignment correction information for the first exposure region based on the first set of images; and projecting images on the first exposure region based on the alignment correction information.

12. The method of claim 11, further comprising:

positioning the stage such that the alignment system of the photolithography machine is opposite a second exposure region of the substrate;

capturing a second set of images using the plurality of microscope cameras of the second exposure region, each image including a respective fiducial associated with the second exposure region;

determining alignment correction information for second exposure regions based on the second set of images; and projecting images on the second exposure region based on the alignment correction information.

13. The method of claim 12, wherein the second set of images are captured after the first set of images are captured, and wherein the images on the first exposure region are projected after projecting images on the second exposure region.

14. The method of claim 13, further comprising:

aligning a projection system of the photolithography machine above the second exposure region based on the alignment correction information associated with the second exposure region; and aligning the projection system of the photolithography machine above the first exposure region based on the alignment correction information associated with the first exposure region.

15. The method of claim 11, wherein the fiducials are located on a top surface of the substrate.

16. The method of claim 11, wherein the fiducials are located on a bottom surface or intermediate layer of the substrate.

17. The method of claim 11, further comprising:

executing a machine vision and edge detection algorithm to determine locations of the fiducials in the first exposure region.

18. An alignment system for a photolithography machine, comprising:

a supporting structure positioned adjacent to a projection system of the photolithography machine; and a plurality of microscope cameras coupled to the supporting structure having a fixed focus, each microscope camera comprising a single microscope objective to provide a single fixed focus position and each microscope camera configured to detect a respective fiducial in a respective exposure region of a substrate, wherein each of the plurality of microscope cameras is configured to detect fiducials at different heights relative to between the stage and the plurality of microscope cameras using the respective fixed focus.

19. The alignment system of claim 18, wherein at least one of the plurality of microscope cameras has a numerical aperture equal to or less than 0.15.

20. The alignment system of claim 18, wherein each of the plurality of microscope cameras include a CMOS image sensor.

21. The photolithography machine of claim 1, wherein the alignment system is configured to capture fiducial images of a plurality of regions and generate alignment information for each region of the plurality of regions based on the fiducial images, and wherein the projection system is configured to project the images on each region of the plurality of regions based on the respective alignment information after all fiducial images of the plurality of regions are captured.

* * * * *